United States Patent [19]
Murphy

[11] Patent Number: 5,716,222
[45] Date of Patent: Feb. 10, 1998

[54] BALL GRID ARRAY INCLUDING MODIFIED HARD BALL CONTACTS AND APPARATUS FOR ATTACHING HARD BALL CONTACTS TO A BALL GRID ARRAY

[75] Inventor: James V. Murphy, Warwick, R.I.

[73] Assignee: Advanced Interconnections Corporation, West Warwick, R.I.

[21] Appl. No.: 689,529

[22] Filed: Aug. 8, 1996

Related U.S. Application Data

[63] Continuation-in-part of Ser. No. 552,602, Nov. 3, 1995.

[51] Int. Cl.$^6$ ........................................ H01R 4/58
[52] U.S. Cl. ........................ 439/91; 174/260; 361/771; 361/772
[58] Field of Search ........................ 361/773, 772, 361/774, 767; 174/260, 261, 250; 439/91, 66, 697; 29/878, 879; 228/180.22

[56] References Cited

U.S. PATENT DOCUMENTS

| | | | |
|---|---|---|---|
| 3,971,610 | 7/1976 | Butchoff et al. | 439/75 |
| 5,477,933 | 12/1995 | Nguyen | 174/260 |
| 5,483,421 | 1/1996 | Gedney et al. | 361/771 |
| 5,491,303 | 2/1996 | Weiss | 174/262 |
| 5,531,021 | 7/1996 | Kolman et al. | 439/66 |

*Primary Examiner*—Neil Abrams
*Assistant Examiner*—Barry Standig
*Attorney, Agent, or Firm*—Salter & Michaelson

[57] ABSTRACT

A plurality of rigid, generally spherical contact elements are attached to the solder balls of a ball grid array (BGA) package to provide rigid contact points that are suitable for engagement with the contacts of a direct BGA socket assembly. The contact elements include a flattened circumferential surface and a circumferential groove formed in the flattened surface. The circumferential groove divides the contact element into opposing hemispheres. An alignment assembly for aligning the contact elements with the BGA solder ball footprint includes a carrier sheet of electrically insulative, flexible material having a plurality of holes arranged in a predetermined array corresponding to the footprint of solder balls. The contact elements are snap received within the holes of the carrier sheet such that one hemisphere of the contact element is disposed on each side of the carrier sheet. The alignment assembly further includes an alignment fixture for receiving the carrier sheet and BGA package in overlying relation. The alignment fixture includes alignment pins for aligning the carrier sheet in a predetermined position, and alignment arms for aligning the BGA package relative to the carrier sheet. In a method for attaching the contact elements to the solder balls, the solder balls are heated to a reflow temperature wherein gravity forces BGA package downwardly onto the contact element and the facing hemisphere of the contacts are attached to the solder ball while the opposing hemisphere remains exposed for engagement with the socket contact.

20 Claims, 6 Drawing Sheets

BALL GRID ARRAY INCLUDING MODIFIED HARD BALL CONTACTS AND APPARATUS FOR ATTACHING HARD BALL CONTACTS TO A BALL GRID ARRAY

CROSS-REFERENCE TO RELATED APPLICATIONS

This application is a continuation-in-part of co-pending U.S. application Ser. No. 08/552,602, filed on Nov. 3, 1995 commonly assigned with the present application.

BACKGROUND AND SUMMARY OF INVENTION

The instant invention relates to ball grid array (BGA) socketing devices, and more particularly to a modified BGA package having hard ball contacts, and apparatus for attaching the hard ball contacts to the BGA package.

BGA socketing systems have heretofore been known in the art. In this regard, an improved BGA socket assembly is the primary subject matter of the parent application Ser. No. 08/552,602. The socket assemblies as disclosed in the '602 application are known as direct socket systems wherein the BGA package is directly received into a socket assembly and retained without soldering of the solder ball contacts. The direct socket assemblies enable quick and easy removal, and replacement of the BGA package for repair or upgrade without soldering of the BGA package to an adapter board. However, a significant problem has been encountered in virtually every socket system developed to date.

The primary problem is that the socket contacts in a majority of the known socket devices include only a single focused point of contact for engaging the solder ball of the BGA package. While a gas tight seal between the socket contact and the solder ball is initially created, it has been found that solder tends to creep over time, i.e. it flows away from the socket contact, thereby compromising the integrity of the gas tight connection point. Flowing away, or creeping, of the solder may ultimately result in failure of the connection. In response to this known problem, the '602 parent application discloses a plurality of multi-fingered socket contacts which provides multiple engagement points to engage and capture the solder ball of the BGA thereby reducing the creep problems associated with single point contact sockets. While the '602 contact assemblies have been found to be extremely effective in reducing the creep factor, it has nevertheless been found that there is still some creep associated with the improved multi-point socket contacts. Accordingly, there is presently a need for developing a modified BGA and BGA socket arrangement which completely eliminates the problems associated with solder creep.

The instant invention overcomes the problems of the prior art by providing a modified BGA package including a plurality of rigid, generally spherical contact elements, i.e. hard ball contacts, which are solder attached to the solder balls. The rigid spherical contact elements provide a rigid point of contact for engagement with the socket contact and insure a stable and consistent electrical connection between the BGA and the socket. More specifically, the spherical contact elements include a flattened circumferential surface and a circumferential groove formed in the flattened surface.

The instant invention further provides an alignment assembly for aligning the spherical contact elements with the BGA solder ball footprint. The alignment assembly includes a carrier sheet of electrically insulative, flexible material for temporarily positioning the contact elements in the desired footprint, and an alignment fixture for receiving and aligning the carrier sheet and BGA package in overlying relation. The carrier sheet includes a plurality of holes arranged in a predetermined array corresponding to the footprint of solder balls, and the spherical contact elements are snap received within the holes of the carrier sheet so that one hemisphere of the contact element is disposed on each side of the carrier sheet. The alignment fixture includes alignment pins which are receivable in corresponding alignment holes in the carrier sheet for aligning the carrier sheet in a predetermined position, and further includes alignment arms engagable with the side edges of the BGA package for aligning the BGA package on top of the carrier sheet.

The contact elements are soldered to the solder balls by heating the aligned BGA package and carrier sheet to a reflow temperature of the solder balls wherein gravity forces BGA package downwardly onto the contact elements so that the hard ball contacts are at least partially imbedded within the solder. The alignment pins limit downward movement of the BGA package so that only the upwardly facing hemispheres of the contacts are imbedded within the solder balls while the opposing hemisphere on the opposing side of the carrier sheet remains exposed for engagement with the socket contact. The carrier sheet may be provided with a coating of solder masking on one surface thereof to prevent the solder from migrating through the carrier sheet onto the opposing hemisphere of the contact, although the use of the solder mask is not absolutely required.

Accordingly, among the objects of the instant invention are: the provision of a rigid spherical contact element, i.e. hard ball contact, for providing a rigid point of contact in a solder ball; the provision of a spherical contact element having a circumferential groove; the provision of a modified BGA package including a plurality of rigid contact elements imbedded within the solder balls of the package; the provision of an alignment assembly for aligning the contact elements with the BGA solder balls; and the provision of a method for attaching the contact elements to the solder balls such that at least a portion of the contact elements are exposed for engagement with a socket contact.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE PREFERRED EMBODIMENT

Figure 1:
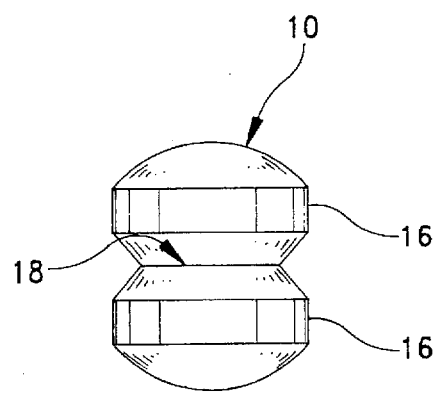
FIG. 1 is an elevational view of the contact element of the instant invention.
Figure 2:
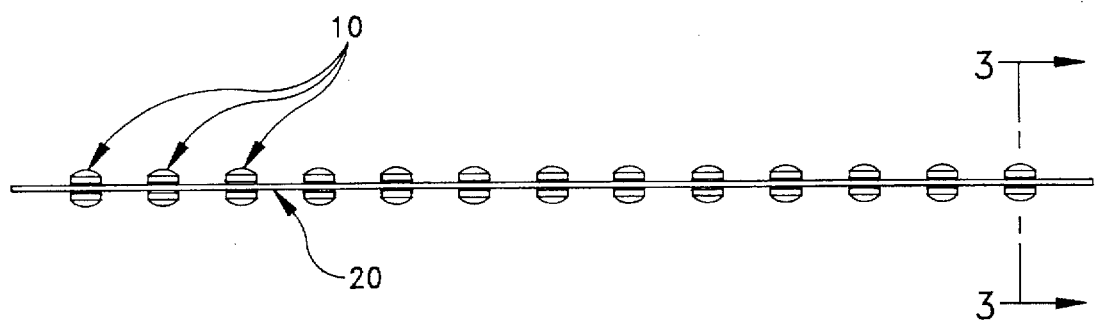
FIG. 2 is a side view of a plurality of contact elements mounted in a flexible carrier sheet.

Referring now to the drawings, the contact element of the instant invention is illustrated and generally indicated at 10 in FIGS. 1–7. As will hereinafter be more fully described, the instant contact element 10, i.e hard ball contact, is adapted to be imbedded within a solder ball 12 of a BGA package generally indicated at 14 to provide a rigid point of contact for engagement with a socket contact and thus to insure a stable and consistent electrical connection between the BGA package 14 and the socket.

The contact elements 10 are preferably fashioned from rigid, electrically conductive materials, such as gold-plated brass, and they are preferably generally spherical in shape. The diameter of the sphere is not considered to be critical to the invention, although the provision of a 0.032 inch spherical ball is thought to be ideal for imbedding in a typical BGA solder ball. The contact elements 10 include flattened circumferential surfaces 16 and a circumferential V-shaped groove generally indicated at 18 which divides the contact element 10 into opposing hemispheres similar to the shape of an hourglass. The groove 18 is formed generally in the middle of the flattened surfaces 16 such that each hemisphere includes one of the flattened surface 16. The circumferential groove 18 enables the contact element 10 to be temporarily received in a carrier sheet to be described hereinafter. While the contact element 10 is specifically described as comprising a spherical element, it is to be understood that other configurations of the contact element are also suitable. For example, the contact elements could consist of a cylinder with a circumferential groove formed in the outer wall of the cylinder to divide the cylinder into upper and lower sections. One or both ends of the cylinder could be rounded or otherwise shaped to provide a desired contact surface.

Referring now to FIGS. 2–7, the instant invention further provides an alignment assembly for aligning the spherical contact elements 10 with a BGA solder ball footprint. The alignment assembly includes a carrier sheet of electrically insulative, flexible material generally indicated at 20 for temporarily positioning the contact elements 10 in the desired footprint, and an alignment fixture generally indicated at 22 for receiving and aligning the carrier sheet 20 and BGA package 14 in overlying relation. The carrier sheet 20 is preferably formed from an electrically insulative, resinous, flexible plastic material and it includes a plurality of holes 24 (FIG. 3) arranged in a predetermined array corresponding to the footprint of solder balls. The preferred material for the carrier sheet 20 is 0.005 inch thick Kapton, made by Dupont, which has a high temperature resistance suitable for vapor phase soldering. Additional specific features of the carrier sheet 20 are disclosed in the U.S. Pat. to Murphy No. Re. 32,540, the contents of which are incorporated by reference.

Figure 3:
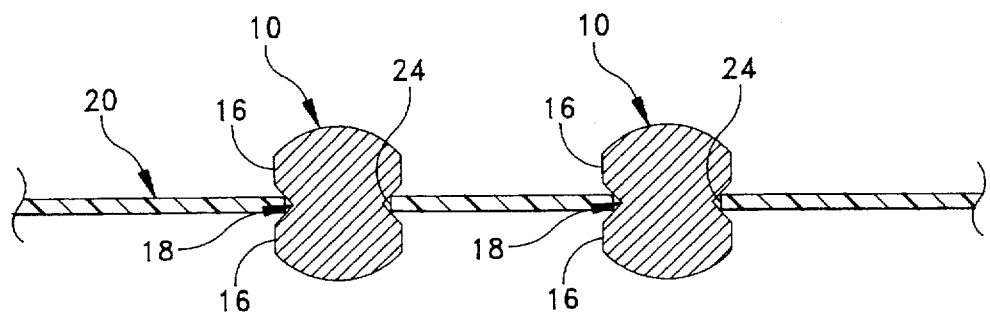
FIG. 3 is a cross-sectional view thereof taken along line 3—3 of FIG. 2.
Figure 4:
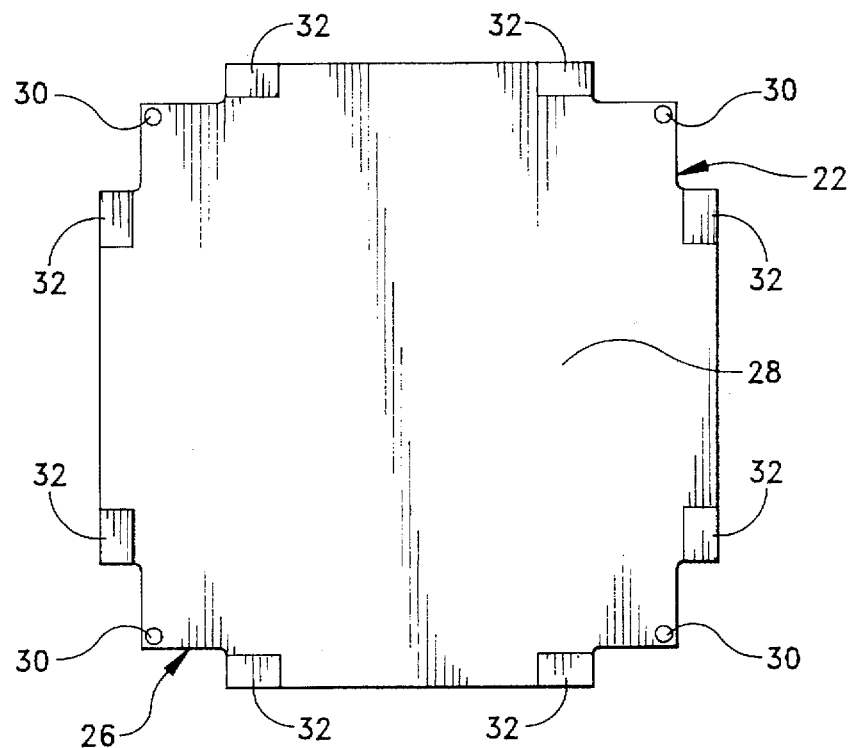
FIG. 4 is a top view of the alignment fixture of the instant invention.

The spherical contact elements 10 are snap received within the holes 24 of the carrier sheet 20 such that one hemisphere of the contact element 10 is disposed on each side of the carrier sheet 20 (FIG. 3). In this regard, it is pointed out that the thickness of the carrier sheet 20 is less than the thickness of the groove 18 to facilitate engagement and disengagement of the contact elements 10. The tapered side surfaces of the V-shaped groove also facilitate engagement and disengagement of the contact elements 10 in the holes 24.

The alignment fixture 22 includes a base generally indicated at 26 having an upper supporting surface 28, a plurality of alignment pins 30 extending upwardly from the supporting surface 28, and a plurality of alignment arms 32 extending upwardly from the side edges of the base 26. The alignment pins 30 are receivable in corresponding alignment holes (not shown) in the carrier sheet 20 for aligning the carrier sheet 20 in a predetermined position on the base 26. The alignment arms 32 are engagable with the side edges of the BGA package 14 for aligning the BGA package 14 on top of the carrier sheet 20.

Figure 5:
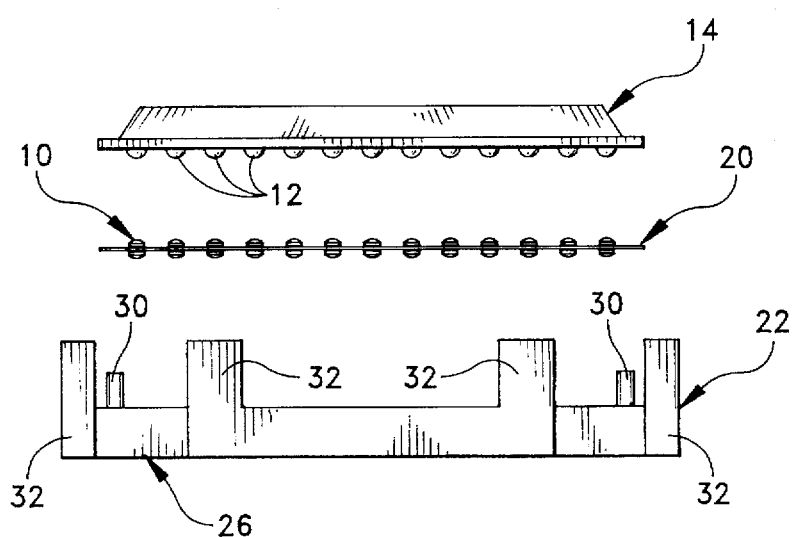
FIG. 5 is an exploded assembly view showing alignment of the BGA package, carrier sheet and alignment fixture.
Figure 6:
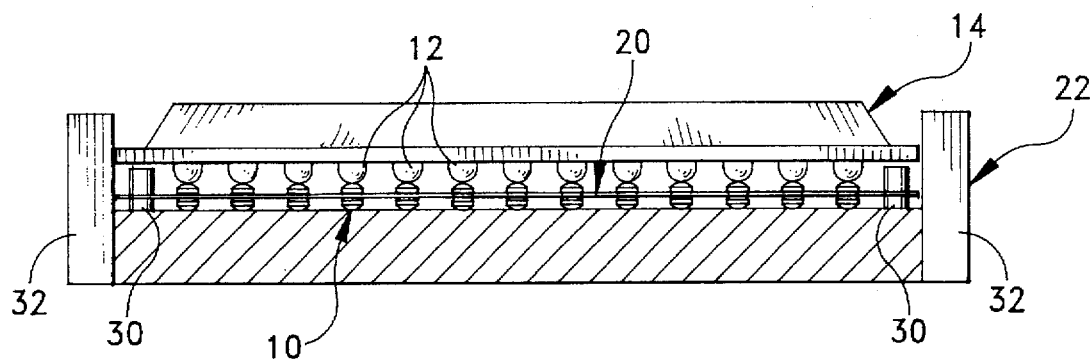
FIG. 6 is an assembly view showing the BGA package and the carrier sheet fully assembled on the alignment fixture.
Figure 7:
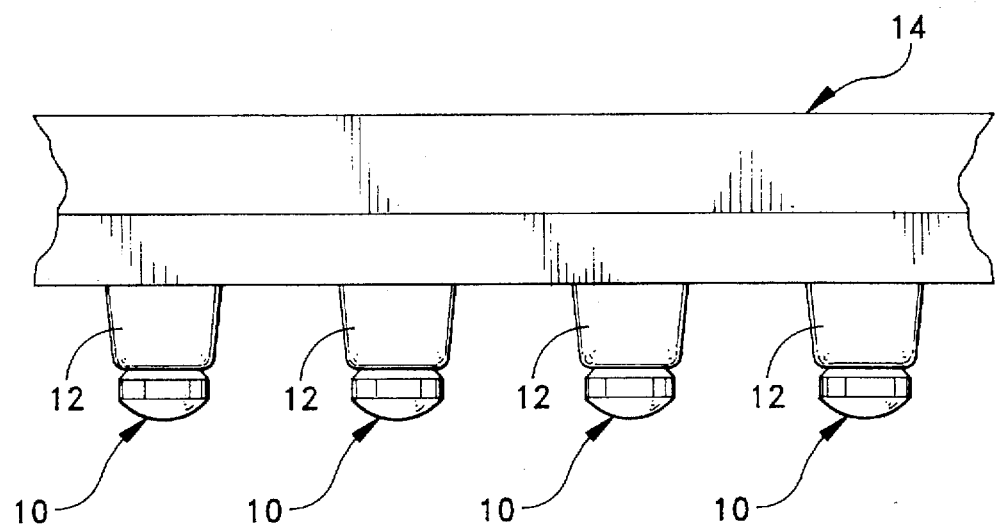
FIG. 7 is an enlarged side elevational view showing the contact elements imbedded into the solder balls of the BGA package.

Referring to FIGS. 5–7, the method for attaching the contact elements 10 to the solder balls 12 is disclosed. The carrier sheet 20 is placed into the alignment fixture 22 with the alignment pins 30 received into the alignment holes of the carrier sheet 20. The BGA package 14 is then received on top of the carrier sheet 20 with the side edges of the BGA package 14 aligned within the alignment arms 32 (FIG. 6). Still referring to FIG. 6, it can be seen that the solder balls 12 of the BGA package 14 are in direct alignment with the contact elements 10 and are ready to be soldered into position. The assembled pieces is thereafter heated to a reflow temperature of the solder balls 12 wherein gravity forces BGA package 14 downwardly onto the contact elements 10. In this regard, the upwardly facing hemispheres of the contacts 10 are imbedded within the solder balls 12 while the opposing hemisphere on the opposing side of the carrier sheet 20 remains exposed for engagement with a socket contact. During soldering, the upper ends of the alignment pins 30 limit downward movement of the BGA package 14 so that the solder balls 12 only surround the upper hemisphere of the contact element 10. To further prevent solder from migrating through the carrier sheet 20 to the opposing hemisphere, the carrier sheet 20 is preferably provided with a coating of solder masking (not shown) on one surface thereof. After the solder balls 12 cool, the carrier sheet 20 may be peeled away from the imbedded contact elements 10 to reveal the modified BGA solder contacts. As can be seen in FIG. 7, the resulting product is a BGA package 14 including a plurality of rigid contact points 10 suitable for receipt in a socket assembly.

Figure 8:
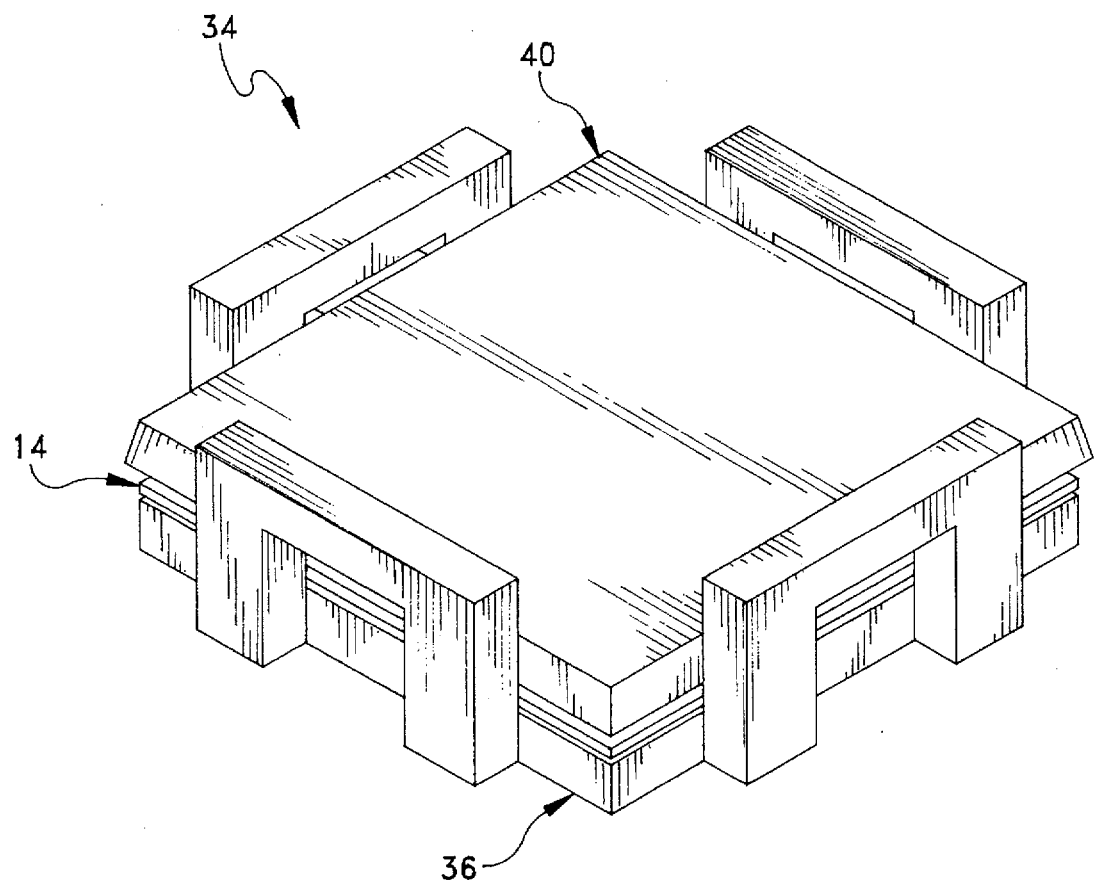
FIG. 8 is a perspective view of a socket assembly including the modified hard ball BGA mounted therein in accordance with the instant invention.
Figure 9:
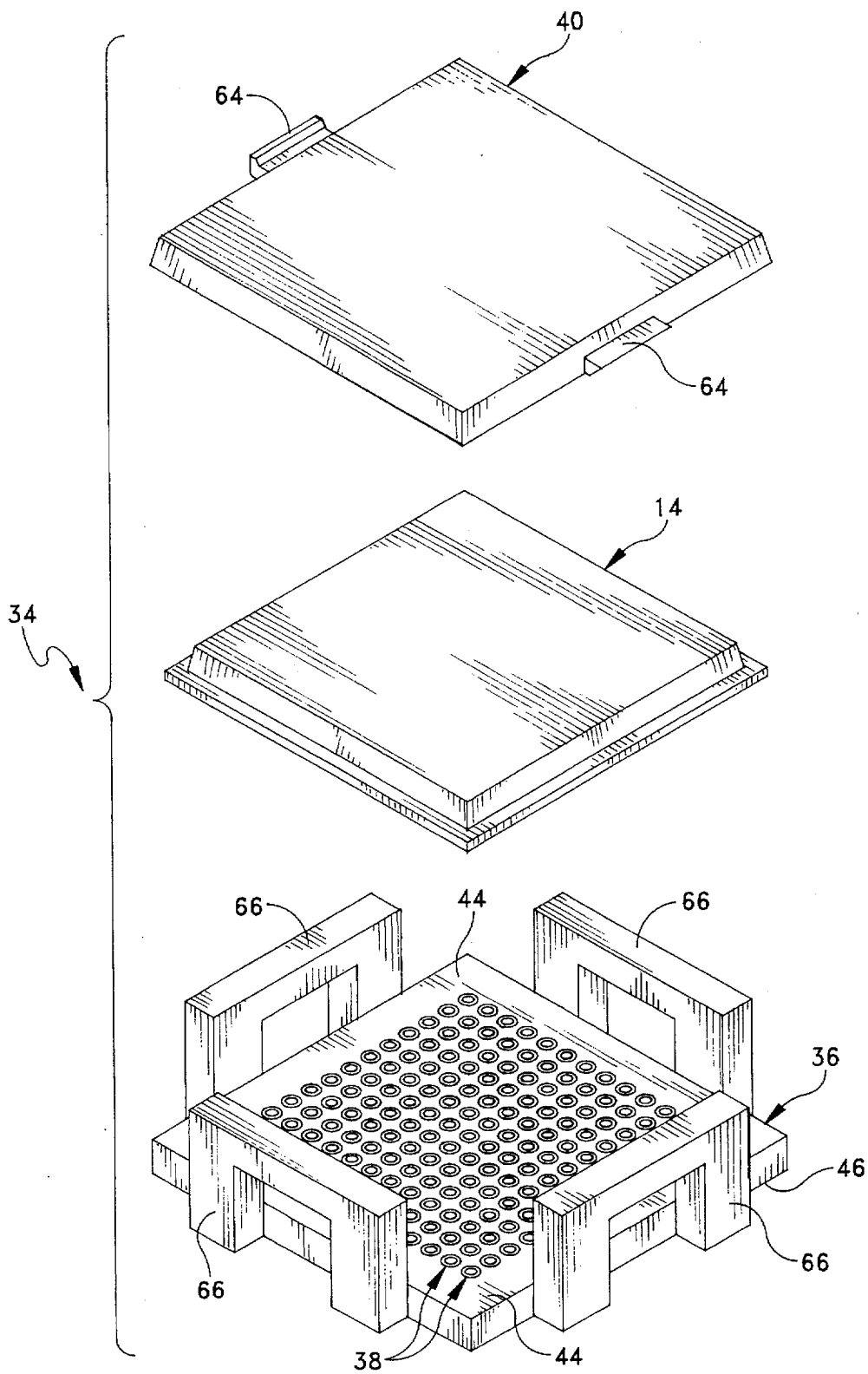
FIG. 9 is an exploded assembly view thereof.
Figure 10:
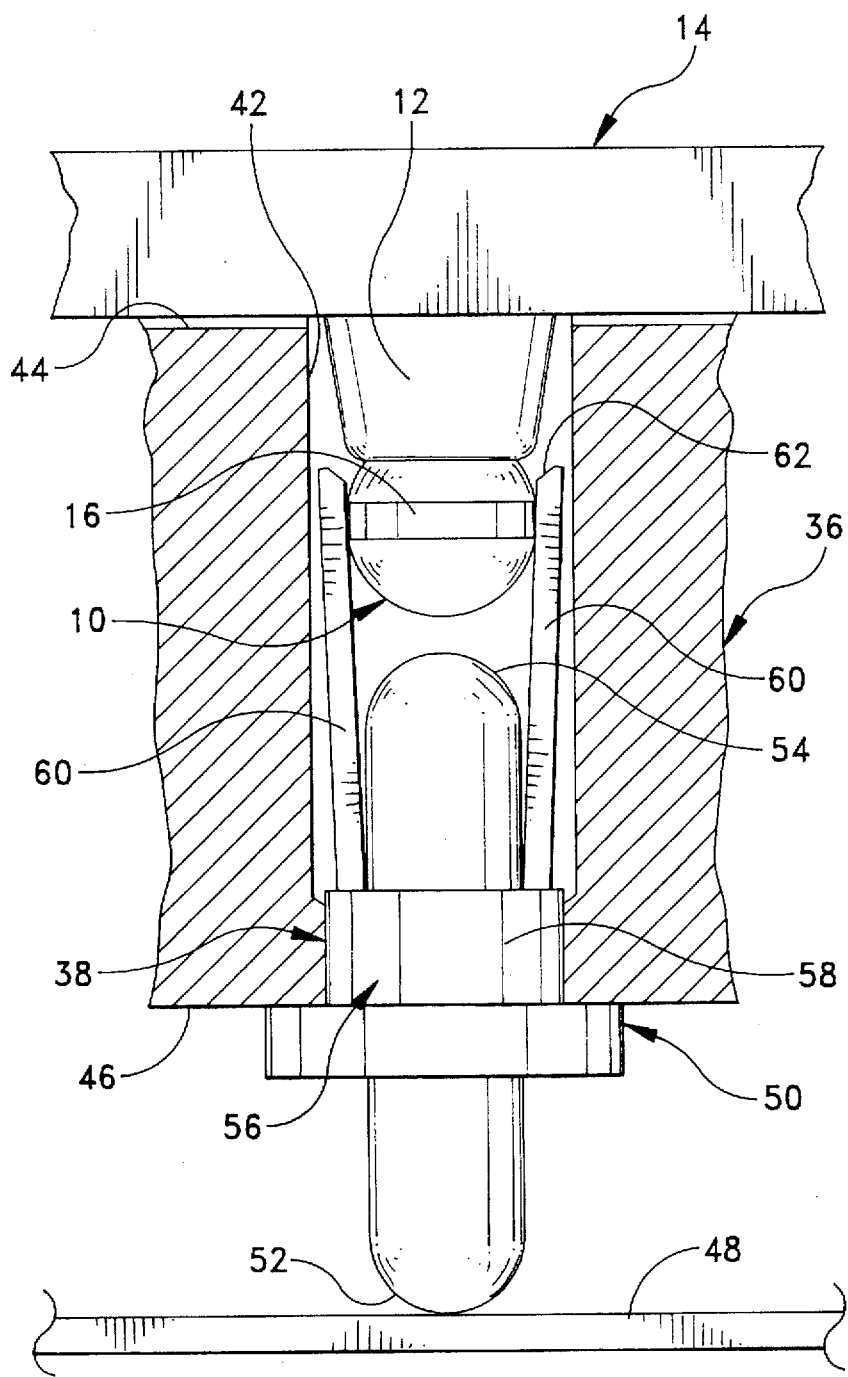
FIG. 10 is an enlarged elevational view, partially in cross-section, of one of the contact assemblies showing the hard ball contact seated into the multi-point contact of the socket assembly.

Referring to FIGS. 8–10, a modified BGA package 14 in accordance with the instant invention is mounted in a socket assembly generally indicated at 34. The socket assembly 34 comprises an electrically insulative, planer socket body generally indicated at 36, a plurality of electrically conductive contact assemblies generally indicated at 38, and a cover plate generally indicated at 40. The socket body 36 is preferably formed from an electrically insulative plastic material, such as a molded glass-filled polyester, or glass epoxy, and includes a plurality of vias 42 extending through the socket body 36 between upper and lower surfaces 44, 46, respectively. The vias 42 are arranged in a predetermined footprint corresponding to the particular array of ball contacts on the ball grid array package 14 to be socketed.

The contact assemblies 38 are respectively disposed within the vias 42 and, in general, each contact assembly 38 includes an upper contact end adjacent the upper surface 44 of the socket body 36 for engaging a respective contact 10 of the modified BGA 14 and a lower terminal end adjacent the lower surface 46 for engaging a respective terminal pad of a circuit board 48.

The contact assembly 38 comprises a conductive cylindrical pin member generally indicated at 50 having a lower terminal end 52 projecting outwardly from the lower surface 46 of the socket body 36, and an upper end 54. The pin member 50 is preferably formed from brass.

The contact assembly further comprises a multi-fingered contact member generally indicated at 56 having a generally tubular body portion 58, and a plurality of resilient finger portions 60 which extend upwardly from the body portion 58. The contact member 56 is preferably stamped and formed into a generally cylindrical shape from a thin sheet of conductive metallic material, such as beryllium copper material, and is slidably received around the upper contact end 54 of the pin member 50, wherein the finger portions 60 extend upwardly from the body portion 58 past the upper end 54 of the pin member 50. The finger portions 60 are formed with a slight inward bend so as to be normally biased for inward movement toward the pin member 50, and are further formed with a chamfer 62 at the terminal end thereof. The assembled pin member 50 and contact member 56 are received in a reduced diameter end portion of the via 42 with the upper contact end 54 of the pin member 50 and the finger portions 60 of the contact member 56 adjacent to the upper surface 44 of the socket body 36.

In use, the BGA package 14 is received in assembled relation with the socket body 36 adjacent the upper surface 44 wherein the modified contact elements 10 extend downwardly into the top opening of the vias 42 and are received in engagement with upper portions of the contact assembly 38. More specifically, during setting of the ball contact 10, the finger portions 60 wipe across the surfaces of the ball contact 10 to establish a good electrical contact. The chamfered ends 62 of the fingers 60 facilitate wiping movement of the fingers 60 across the surface of the ball contact 10 so that they do not gouge the ball contact 10. While the ball contact 10 is seated, the finger portions 60 exert an inward normal force to maintain the contact established during seating thereof.

The BGA package 14 is maintained in assembled relation with the socket body 36 by means of the cover plate 40 which is received in snap-engagement with the socket body 36 by means of interengaging formations 64, 66 respectively formed on the cover 40 and socket body 36. It is to be understood that various other types of engagement arrangements are also acceptable within the scope of the invention.

It can therefore be seen that the instant invention provides a modified BGA package 14 which is uniquely adapted for receipt in a direct BGA socket assembly 34. The contact element 10 is uniquely configured to provide a rounded spherical contact point similar to a solder sphere 12, yet it also provides a rigid contact point which will provide a consistent and stable contact point for the BGA package 14. The alignment fixture 22 and carrier sheet 20 provide an extremely simple and effective means for aligning the contact elements 10 and attaching the contact elements 10 to the solder spheres 12. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

I claim:

1. A contact element for providing a rigid contact point in a preformed solder ball comprising a rigid, metallic, generally spherical ball having a circumferential groove formed therein which divides said ball into opposing hemispheres, said contact element having one of said hemispheres attached to a solder ball while the opposing hemisphere is exposed for engagement.

2. A contact element for providing a rigid contact point in a preformed solder ball comprising a rigid, metallic generally spherical ball having a flattened circumferential surface formed thereon, said contact element further having a circumferential groove formed in said flattened surface which divides said ball into opposing hemispheres each including a respective portion of said flattened surface, said contact element having one of said hemispheres attached to said solder ball while the opposing hemisphere is exposed for engagement.

3. An electrical circuit assembly comprising:
   a substrate supporting an electrical circuit structure thereon;
   at least one solder ball arranged on a surface of said substrate, said solder ball electrically communicating with at least a portion of said electrical circuit structure; and
   a rigid metallic contact element attached to said solder ball, said contact element having at least a portion thereof exposed for engagement with a socket contact.

4. The electrical circuit assembly of claim 3 wherein said contact element comprises a generally spherical ball having a circumferential groove formed therein which divides said ball into opposing hemispheres, said contact element having one of said hemispheres attached to said solder ball while the opposing hemisphere is exposed for engagement.

5. The electrical circuit assembly of claim 3 wherein said contact element comprises a generally spherical ball having a flattened circumferential surface formed thereon, said ball further having a circumferential groove formed in said flattened surface which divides said ball into opposing hemispheres each including a portion of said flattened surface, said contact element having one of said hemispheres attached to said solder ball while the opposing hemisphere is exposed for engagement.

6. The electrical circuit assembly of claim 3 wherein said contact element includes a circumferential groove formed therein which divides said contact element into opposing sections, said contact element having one of said sections attached to said solder ball while the opposing section is exposed for engagement.

7. The electrical circuit assembly of claim 3 wherein said contact element includes a flattened circumferential surface formed thereon, said contact element further having a circumferential groove formed in said flattened surface which divides said contact element into opposing sections each including a portion of said flattened surface, said contact element having one of said sections attached to said solder ball while the opposing section is exposed for engagement.

8. A ball grid array package comprising:
   a substrate enclosing an electric circuit structure;
   a plurality of solder balls arranged on a lower surface of said substrate, each of said solder balls electrically communicating with said electric circuit structure; and
   a plurality of rigid metallic contact elements respectively secured to said solder balls, said contact elements having at least a portion thereof exposed for engagement with a socket contact.

9. The ball grid array package of claim 8 wherein said contact elements comprise a generally spherical ball having a circumferential groove formed therein which divides said ball into opposing hemispheres, said contact element having one of said hemispheres attached to said solder ball while the opposing hemisphere is exposed for engagement.

10. The ball grid array package of claim 8 wherein said contact elements comprise a generally spherical ball having a flattened circumferential surface formed thereon, said ball further having a circumferential groove formed in said flattened surface which divides said ball into opposing hemispheres each including a portion of said flattened surface, said contact element having one of said hemispheres attached to said solder ball while the opposing hemisphere is exposed for engagement.

11. The ball grid array package of claim 7 wherein said contact elements include a circumferential groove formed therein which divides said contact element into opposing sections, said contact element having one of said sections attached to said solder ball while the opposing section is exposed for engagement.

12. The ball grid array package of claim 8 wherein said contact elements include a flattened circumferential surface formed thereon, said contact element further having a circumferential groove formed in said flattened surface which divides said contact element into opposing sections each including a portion of said flattened surface, said contact element having one of said sections attached to said solder ball while the opposing section is exposed for engagement.

13. A method of attaching a rigid metallic contact element to a solder ball of a ball grid array package comprising the steps of:

arranging a plurality of rigid metallic contact elements in a predetermined array corresponding to a footprint of solder balls on a ball grid array package to receive said contact elements;

aligning said ball grid array package with said array of contact elements such that said footprint of solder balls is in corresponding alignment with said array of contact elements;

heating said solder balls to a predetermined reflow temperature wherein said solder balls are softened;

at least partially sinking said contact elements into said solder balls; and cooling said solder balls to rigidly secure said contact elements to said solder balls.

14. The method of claim 13 wherein said ball grid array package is received on top of said array of contact elements and gravity forces said reflowed solder balls downwardly onto at least a portion of said contact elements.

15. The method of claim 7 wherein said step of arranging said contact elements in an array comprises the steps of providing a carrier sheet of electrically insulative, flexible material having a plurality of holes arranged in said predetermined array, and further providing a plurality of contact elements having a circumferential groove adapted to be snap received into the holes of said carrier sheet.

16. The method of claim 15 wherein said step of aligning said ball grid array package with said contact elements comprises the steps of mounting said carrier sheet with said contact elements snap received therein and said ball grid array package in an alignment fixture having means for fixing a position of said carrier sheet relative to a position of said ball grid array package.

17. An alignment assembly for aligning a plurality of contact elements with a footprint of solder balls on a ball grid array package comprising:

a carrier sheet of electrically insulative, flexible material having a plurality of holes arranged in a predetermined array corresponding to a footprint of solder balls;

a plurality of contact elements having a circumferential groove adapted to be snap received into the holes of said carrier sheet; and an alignment fixture having a base, said base having a supporting surface for receiving said carrier sheet thereon, said alignment fixture further having means for aligning said carrier sheet in a predetermined position, and means for aligning said ball grid array package relative to said carrier sheet.

18. The alignment assembly of claim 17 wherein said means for aligning said carrier sheet comprises a plurality of alignment holes in said carrier sheet, and a plurality of corresponding alignment pins extending upwardly from said supporting surface of said base, said alignment pins being received in said alignment holes of said carrier sheet during alignment.

19. The alignment assembly of claim 18 wherein said means for aligning said ball grid array package relative to said carrier sheet comprises a plurality of arm members extending upwardly from said support surface of said base.

20. The alignment assembly of claim 17 wherein said carrier sheet has a layer of solder masking on a surface thereof which faces said ball grid array, said solder masking preventing said solder balls from migrating through said carrier sheet.

* * * * *